United States Patent [19]

Cray et al.

[11] Patent Number: 5,131,233

[45] Date of Patent: Jul. 21, 1992

[54] GAS-LIQUID FORCED TURBULENCE COOLING

[75] Inventors: Seymour R. Cray; Gregory J. Sherwood, both of Colorado Springs, Colo.

[73] Assignee: Cray Computer Corporation, Colorado Springs, Colo.

[21] Appl. No.: 666,362

[22] Filed: Mar. 8, 1991

[51] Int. Cl.[5] ................. F25D 17/02; H01L 25/04
[52] U.S. Cl. ................. 62/64; 165/104.33; 165/80.4; 165/908; 165/911; 62/259.2; 361/385; 357/82; 363/14
[58] Field of Search ............. 62/259.2, 64; 361/385; 357/82; 363/14; 165/104.33, 80.4, 908, 911; 174/15.1

[56] References Cited

U.S. PATENT DOCUMENTS

| | | | |
|---|---|---|---|
| 2,440,930 | 5/1948 | Canilli et al. | 62/171 |
| 2,643,282 | 6/1953 | Greene | 174/15.1 |
| 2,924,635 | 2/1960 | Narbut | 165/104.33 |
| 2,961,476 | 11/1960 | Maslin et al. | 174/15.1 |
| 3,334,684 | 3/1976 | Roush et al. | 165/80.4 |
| 3,339,373 | 9/1967 | Möbius et al. | 62/64 |
| 3,406,244 | 4/1968 | Oktay | 174/15.1 |
| 3,414,753 | 7/1968 | Hruda | 165/80.4 |
| 3,609,991 | 10/1971 | Chu et al. | 62/119 |
| 3,725,566 | 4/1973 | Plizak | 174/15.1 |
| 3,776,305 | 12/1973 | Simmons | 165/107 |
| 3,788,393 | 1/1974 | Plizak, II | 165/109 |
| 4,100,366 | 7/1978 | Mears | 174/15.1 |
| 4,173,996 | 11/1979 | Pierce | 165/105 |
| 4,202,408 | 5/1980 | Temple | 165/109 |
| 4,223,723 | 9/1980 | Hilal | 165/133 |
| 4,485,367 | 11/1984 | Hashizume | 174/15.1 |
| 4,549,407 | 8/1985 | Gruber | 62/304 |
| 4,590,538 | 5/1986 | Cray, Jr. | 361/385 |
| 4,741,385 | 6/1988 | Bergles et al. | 165/1 |
| 4,897,762 | 7/1990 | Daikoku et al. | 361/382 |
| 4,912,600 | 9/1990 | Jaeger et al. | 361/385 |

OTHER PUBLICATIONS

Aakalu; Condensation of Heat Transfer of Dielectric Vapors in Presence of Air; 1983.
Anderson et al.; Microelectronic Cooling by Enhanced Pool Boiling of a Dielectric Fluorocarbon Liquid; 1988.
Bar-Cohen et al.; Bubble-Pumped Convective Augmentation on Vertical-Condenser Surfaces; 1987.
Bar-Cohen et al.; Convective Immersion Cooling of Parallel Vertical Plates; 1984.
Bar-Cohen et al.; Thermosyphon Boiling in Vertical Channels; 1987.
Bar-Cohen; Thermal Design of Immersion Cooling Modules for Electronic Components; 1983.
Bar-Cohen et al.; Wall Superheat Excursions in the Boiling Incipience of Dielectric Fluids; 1986.
Bergles; Liquid Cooling for Electronic Equipment; 1987.
Berles et al.; A Method to Reduce Temperature Overshoots in Immersion Cooling of Microelectronic Devices; 1988.
Bravo et al.; Limits of Boiling Heat Transfer in a Liquid-Filled Enclosure; 1976.
Chu et al.; Thermal Management of Large Scale Digital Computers; 1984.

(List continued on next page.)

*Primary Examiner*—Albert J. Makay
*Assistant Examiner*—William C. Doerrler
*Attorney, Agent, or Firm*—John R. Ley; Bruce R. Winsor

[57] ABSTRACT

A cooling system employs a cooling liquid and a cooling gas in a combined thermodynamic cycle to overcome the flow resistance of dense assemblies of heat generating components and to improve heat transfer by inducing turbulence, thereby reducing the effects of thermal hysteresis and boundary layer formation Sensible heat gain to the cooling liquid and gas and latent heat of vaporization of the cooling liquid also occur in channels through and over the components. The flow of cooling gas propels the cooling liquid through the channels. The cooling system is advantageous for cooling electronic components such as integrated circuits which exhibit relatively high degree of energy and physical density, in supercomputers. The cooling system may also be advantageously combined with an immersion cooling system for the power supply components in the computer.

74 Claims, 5 Drawing Sheets

OTHER PUBLICATIONS

Craig et al.; Heat Transfer and Pressure Drop for High Density Staggered Pin Fin Arrays with Liquid Coolants; 1988.

Danielson; Thermal Management of Electronics by Liquid Immersion; 1987.

Danielson et al.; Saturated Pool Boiling Characteristics of Commercially Available Perfluorinated Inert Liquids; 1987.

Fujii et al.; Nucleate Pool Boiling Heat Transfer from MicroPorous Heating Surface; 1983.

Grimley et al.; Enhancement of Boiling Heat Transfer in Falling Films; 1987.

Hwang et al.; Boiling Heat Transfer of Silicon Integrated Circuits Chip Mounted on a Substrate; 1981.

Incropera; Liquid Immersion Cooling of Electronic Components; 1988.

Incropera; Research Needs in Electronic Cooling; 1987.

Jiji et al.; Experimental Investigation of Single Phase Multi-Jet Impingement Cooling of an Array of Microelectronic Heat Sources; 1987.

Kamehara et al.; Studies on Immersion Cooling for High Density Packaging; 1987.

Kelecy et al.; Effect of Shrouded Pin Fins on Forced Convection Cooling of Discrete Heat Source by Direct Liquid Immersion; 1987.

Krane et al.; Design of a Candidate Thermal Control System for a Cryogenically-Cooled Computer; 1988.

Lee et al.; An Investigation of Short-Heating-Length Effects on Flow Boiling Critical Heat Flux in Subcooled Turbulent Flow; 1987.

Lee et al.; Fluid Selection and Property Effects in Single and Two-Phase Immersion Cooling; 1988.

Liu et al.; Three-Dimensional Natural Convection Cooling of an Array of Heated Protrusions in an Enclosure Filled with Dielectric Fluid; 1987.

Ma et al.; Boiling Jet Impingement Cooling of Simulated Microelectronic Chips; 1983.

Maddox et al.; Single and Two-Phase Convective Heat Transfer From Smooth and Enhanced Microelectronic Heat Sources in a Rectangular Channel; 1988.

Marto et al.; Pool Boiling Heat Transfer From Enhanced Surfaces to Dielectric Fluids; 1982.

Mosinski et al.; Liquid Enhanced Cooling of Microchips; 1987.

Mudawwar et al.; Microelectronic Cooling By Fluorocarbon Liquid Films; 1987.

Nakayama et al.; Cooling Electronic Equipment: Past, Present and Future; 1988.

Nakayama et al.; Experience in Cooling Power Electronic Devices by Phase-Changing Refrigerants and the Prospect of its Application to Cooling Microelectronic Devices; 1987.

Nakayama; Enhancement of Heat Transfer; 1982.

Nonn et al.; Boiling Jet Impingement Cooling of Simulated Microelectronic Heat Sources; 1988.

Oettinger; Thermal Evaluation of VLSI Packages Using Test Chips—A Critical Review; 1984.

Oktay; Departure From Natural Convection (DNC) In Low-Temperature Boiling Heat Transfer Encountered in Cooling Micro-Electronic LSI Devices; 1982.

Park et al.; Boiling Heat Transfer Characteristics of Simulated Microelectronic Chips with Fluorinert Liquids; 1986.

Park et al.; Effects of Size of Simulated Microelectronic Chips on Boiling & Critical Heat Flux; 1986.

Park et al.; Heat Transfer Characteristics of Simulated Microelectronic Chips With Heat Sinks; 1987.

Park et al.; Natural Convection Heat Transfer Characteristics of Simulated Microelectronic Chips; 1985.

Phillips et al.; Forced-Convection, Liquid-Cooled, Microchannel Heat Sinks For High-Power-Density Microelectronics; 1987.

Ramadhyani et al.; Forced Convection Cooling of Discrete Heat Sources With and Without Surface Enhancement; 1987.

Reeber et al.; Heat Transfer of Modified Silicon Surfaces; 1980.

Simons; Direct Liquid Immersion Cooling: Past, Present, and Future; 1987.

Simons et al.; Direct Immersion Cooling Techniques for High Density Electronic Packages and Systems; 1985.

Simons et al.; Immersion Cooling Systems for High Density Electronic Packages; 1977.

Tousignant et al.; An Overview of Electronic Cooling For A Range of Applications; 1989.

Tuckerman et al.; Microcapillary Thermal Interface Technology for VLSI Packaging; 1983.

Yokouchi et al.; Immersion Cooling For High Density Packaging; 1987.

Oktay; Multiliquid Cooling of a Plurality of Electrical Devices; 1967.

Fig_1

Fig_2

GAS-LIQUID FORCED TURBULENCE COOLING

This invention relates to a new and improved cooling technique which is particularly useful for cooling electronic systems, such as high capacity high speed computers, in which a relatively large number of individual heat generating sources, such as integrated circuit chips, are physically positioned in a relatively confined space in a relatively high density configuration. More particularly, the present invention relates to a cooling technique which uses a combination of liquid, gas and vapor thermodynamic and fluid dynamic processes to simultaneously cool components positioned in relatively high heat density generating configurations and in relatively lower heat density generating configurations.

BACKGROUND OF THE INVENTION

In electronic computers substantially all the electrical energy consumed by a computer is ultimately converted to heat. This heat must be removed from the equipment at a rate equal to the average rate at which electrical energy is converted into heat, otherwise the components of the computer will be destroyed. Furthermore, the heat removal must maintain the components of the computer within appropriate operating temperature limits to assure proper functionality. This problem is of significant concern in all computer systems. However, the problem of cooling is particularly acute in high speed, high capacity digital computers, referred to hereinafter as supercomputers, which operate with relatively high heat generating densities in the range of 275 watts per cubic inch, for example.

The capacity for cooling supercomputers has been enhanced as the result of the development of a variety of fluorocarbon (FC) cooling liquids, such as those manufactured by the Minnesota Mining and Manufacturing Company under the name Fluorinert (TM). These FC cooling liquids have high dielectric strength, low viscosity and relatively low boiling points, and are chemically inert. The relatively high dielectric strength of the FC cooling liquids allows the electronic components of the computer to be immersed or otherwise be placed in direct contact with the cooling liquid. One example of a prior art immersion cooling technique for a supercomputer which uses a FC cooling liquid is disclosed in U.S. Pat. No. 4,590,538. In this prior art system, the heat generating components of the supercomputer are directly immersed in a pool of FC cooling liquid. Heat is absorbed from the heat generating components by the FC cooling liquid, which is removed from the supercomputer and circulated through a heat exchanger to extract the heat.

The immersion type of prior art computer cooling system primarily transfers heat by using the sensible heat capacity of the cooling liquid. Sensible heat gain is heat gain which elevates the temperature of the cooling liquid or a cooling gas. The relatively low boiling points of the FC cooling liquids make them desirable for also using the latent heat capacity of vaporization to achieve cooling. Latent heat capacity is heat gain which results in a change in the phase state of the cooling liquid, when a liquid is changed to a vapor. The latent heat capacity of vaporization, i.e., that heat required to vaporize or boil a fixed amount of a liquid at its boiling point temperature, is much greater than the sensible heat capacity, i.e., that heat required to raise the temperature of the same fixed amount of the liquid by one degree.

Although the cooling capacity could be further enhanced over that capacity available from immersion systems, a number of complicating factors have inhibited the effective use of heat gain from latent heat capacity in supercomputers.

A phenomenon known as thermal hysteresis can result in a temperature overshoot at the surface of a device being cooled at the incipience of boiling, in immersion cooling systems using the latent heat capacity of vaporization. In greatly simplified terms, thermal hysteresis can be understood as follows. When the boiling point of a liquid is reached vapor coalesces into bubbles which initially adhere in cavities on the surface being cooled. The bubbles will tend to remain in place until the forces which act to strip them from the surface, such as buoyancy and the flow of the liquid, are stronger than the forces which hold the bubbles in place. The bubbles tend to create localized areas on the surface that are not in contact with the liquid. In these localized areas the heat given up by the surface being cooled heats the vapor in the bubble to a temperature higher than the average temperature of the cooling liquid, a phenomenon known as superheating. A very high temperature exists at the localized areas on the surface to be cooled and, when averaged with those other areas in contact with liquid, elevates the average temperature of the surface being cooled. This creates the thermal hysteresis effect and results in a temperature overshoot at the surface. Thermal hysteresis can have a deleterious effect on the component being cooled because its temperature may exceed the nominal boiling point temperature of the surrounding liquid. Thus, even using a cooling liquid having a lower boiling point in an immersion does not assure that the temperature of the components will not reach destructive temperatures.

Cooling liquid flows in prior art immersion cooling systems have tended to adopt laminar, as opposed to turbulent, regimes. In a laminar flow regime, liquid can be visualized as flowing in several discrete planes or layers of flow with the plane immediately adjacent to a cooled surface, called the boundary layer, being stationary and the outer layers increasing in velocity as the distance from the cooled surface increases. There is resistance to the flow of heat from the cooled surface to the boundary layer and between layers. For the surface to be cooled, the temperature of the boundary layer must be higher than the layers farther from the surface. The boundary layer, and thus the cooled surface, thus experience a temperature significantly higher than the average temperature of the cooling liquid, thereby also inhibiting a more effective cooling effect.

A further complicating factor in cooling supercomputers is the extreme physical density of the logic elements. In order to take full advantage of the very high operating or clock speeds of supercomputers, it is necessary to minimize the propagation time of signals between logic elements. Large numbers of logic elements are typically grouped together in integrated circuits (ICs). One way to minimize signal propagation time is to create very short signal paths between the ICs. Such short signal paths result in a closely adjacent positioning and a dense assembly of ICs. In addition, the trend toward smaller ICs and toward ICs with a greater number of logic elements for the same size has resulted in an increased capacity for heat generation in a given volume. The decreased space between ICs and the greater integration of the ICs have not only contributed to increase the heat generation density but have also restricted the ability to achieve an adequate flow of the cooling liquid to the ICs. The collection of electrical conductors which supply electrical signals to the ICs also restricts the flow of cooling liquid. The collection of conductors, referred to as a "wire mat," may comprise up to seven hundred wires extending from each of three of the four sides of a four inch square circuit module upon which the ICs are positioned. To illustrate the magnitude of the heat generation density and cooling restriction factors, a supercomputer manufactured by the assignee of the present invention may have heat generation densities on the order of 275 watts per cubic inch, and total average heat generated on the order of 500,000 watts.

Several prior art techniques have been developed to partially overcome the problems of thermal hysteresis and boundary layer effects inherent in immersion cooling. Techniques which have been developed include jets or mists of cooling liquid spraying on the surface to be cooled, submerged jets of cooling liquid directed against submerged devices, submerged gas jets or bubble sources which impinge on submerged device to be cooled and falling films of cooling liquid directed over arrays of electronic devices. All of these prior art cooling techniques have resulted in improvement of heat transfer from the device to be cooled, but none of them appear to be capable of reliably delivering adequate cooling for a supercomputer which exhibits high physical placement density and high heat generation density of heat generating components.

It is against this background information that the present invention has evolved even further significant improvements and advancements in the field of cooling supercomputers, electronic components and other high heat density generating configurations.

SUMMARY OF THE INVENTION

One of the significant aspects of the present invention is a new and improved system for cooling a high speed, high capacity computer, or supercomputer, which has circuit or logic modules and ICs with relatively high heat generating densities and relatively stringent cooling requirements, and power supply components with relatively lower heat generating densities and relatively less stringent cooling requirements. According to this aspect of the invention the logic modules are cooled by a turbulent gas-liquid cooling technique which makes use of the latent heat of vaporization of the cooling liquid, in conjunction with sensible heat gain of the cooling liquid and the cooling gas. The power supply components are cooled by immersion cooling whereby heat is absorbed from the power supply components in a pool of cooling liquid. The pool of cooling liquid is a source of cooling liquid supplied to the logic modules. The pool of cooling liquid also receives condensed and unvaporized cooling liquid from the logic modules, thereby receiving a portion of the sensible heat gain of the cooling liquid generated in the logic modules. Latent heat gain of the cooling liquid and sensible heat gain of the cooling gas after passing over the ICs and circuit modules is removed from the system in a cooling gas loop which circulates cooling gas and a vaporized fraction of the cooling liquid through a heat exchanger. Sensible heat gain in the pool is extracted by a cooling liquid loop which passes the cooling liquid in the pool through a heat exchanger.

Another significant aspect of the present invention is the use of a cooling liquid and a cooling gas in combination to achieve a new and improved gas-liquid forced turbulence cooling system for electronic components which exhibit high heat density, stringent cooling requirements, and which are physically constructed to present a significant resistance to the flow of cooling liquid. In accordance with this aspect of the invention the logic modules are constructed to form channels for the flow of cooling gas and cooling liquid through the modules. Components to be cooled, typically integrated circuits (ICs), are mounted in the logic modules to provide heat communication with the channels. A mixture of sprayed cooling liquid and a flow of pressurized cooling gas is simultaneously passed through the channels of the modules and over the components of the modules. The relative flow rates of the cooling gas and the cooling liquid are such that the cooling gas imparts energy to the cooling liquid overcoming resistance to the flow of the cooling liquid and propelling the cooling liquid through the channels. The cooling liquid and cooling gas are passed over the ICs absorbing heat from the ICs. The ICs are cooled by sensible heat gain to the cooling liquid and the cooling gas and by latent heat gain which vaporizes the cooling liquid. Turbulence is induced in the flow of cooling liquid to overcome the effects of thermal hysteresis, and to prevent the formation of boundary layers on the surface of the ICs. Compared to liquid immersion cooling, more effective cooling is obtained by the liquid-pressured gas technique A more complete appreciation of the present invention and its scope can be obtained from understanding the accompanying drawings, which are briefly summarized below, the following detailed description of a presently preferred embodiment of the invention, and the appended claims.

DETAILED DESCRIPTION

Figure 1:
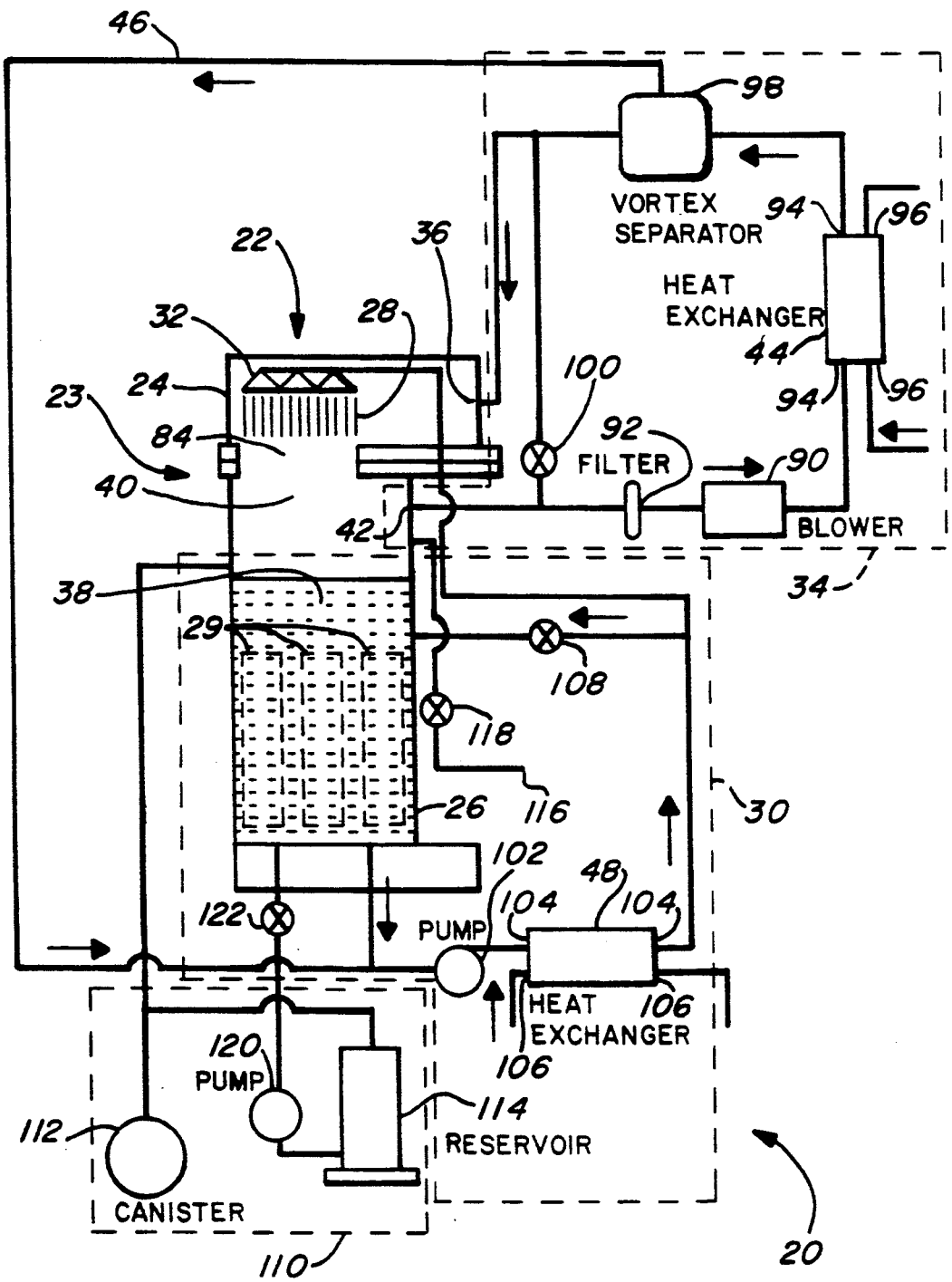
FIG. 1 is a schematic diagram of a presently preferred embodiment of a cooling system of the present invention shown in conjunction with a computer.

A presently preferred embodiment of a cooling system 20 of the present invention is illustrated in FIG. 1. The cooling system 20 is advantageously used to cool the electronic components of a computer, for example a supercomputer 22, which is also shown in simplified form in FIG. 1. The cooling system 20 may advantageously be used in applications other than computers, and is particularly advantageous for those cooling applications in which there exist components which exhibit both a relatively high density of heat generation and a relatively low density of heat generation.

The typical supercomputer 22 is made up of a plurality of separate individual computing sections, each of which is primarily contained within its own separate housing 23. Each housing 23 is divided into an upper logic module chamber 24 and a lower power supply chamber 26. The logic module chamber 24 contains the numerous and typical electronic computing integrated circuit (IC) components, such as microprocessors, logic circuits and memories, which are typically connected to printed circuit boards (PCBs). Groups of PCBs may be connected together in electronic circuit modules, referred to as logic modules 28, and a plurality of logic modules are located in the logic module chamber 24. The power supply chamber 26 contains assemblies of the typical power supply components 29, such as transformers, rectifiers and filter capacitors, which convert standard electrical power, typically three phase AC power at 240 or 480 volts, to low voltage DC power suitable for operation of the ICs in the logic module chamber 24.

The ICs of the logic module chamber 24 and the power supply equipment of the power supply chamber 26 generate heat during operation of the computer 22. In a typical supercomputer 22, approximately 65% to 70% of the heat is generated by the logic module components and approximately 30% to 35% of the heat is generated by the power supply components. The physical size of the logic module chamber 24 is typically significantly less than the physical size of the power supply chamber 26. The logic module ICs are physically small relative to the amount of heat they generate and are closely spaced relative to one another ("densely packaged"), as a result of their positions on the PCBs, the close adjacency of the PCBs in each module, and the closely separated positions of the adjacent logic modules in the logic module chamber 26. The logic module ICs are also relatively intolerant to high temperatures. Due to the dense packaging of the ICs and the relatively large amount of heat the ICs generate, adequately cooling the logic module chamber requires the effective removal of a relatively high heat density. The equipment in the power supply chamber 26 has a greater tolerance for a relatively broad range of acceptable operating temperatures. In addition the power supply components 29 are physically large relative to the amount of heat generated and are physically spaced or separated from other similar equipment within the power supply chamber 26. A relatively lower density of heat generation occurs in the power supply chamber 26, and the cooling requirements are generally not as rigorous as those applicable to the logic module chamber 24. The different densities of heat generation and the different tolerances for temperature of the components of the two chambers 24 and 26 have complicated the problem of adequate cooling of supercomputers and have required compromises in certain performance characteristics of supercomputers in the past.

The cooling system 20 of the present invention provides an improved capability for more effectively addressing different cooling requirements and restrictions applicable to the logic module chamber and the power supply chamber, within a single cooling system. The cooling system 20 uses a combination of liquid cooling fluid and gas cooling fluid circulating in two separate but interactive thermodynamic cooling loops. Each cooling loop also delivers the cooling fluids to the components to be cooled under different fluid dynamic conditions.

To cool the logic modules 28 of the logic module chamber 24, cooling liquid from a liquid circulation cooling loop 30 is sprayed from nozzles 32 onto the logic modules 28. Pressurized gas from a gas circulation cooling loop 34 is forced into the logic module chamber 24 at a gas inlet port 36. Droplets from the spray of cooling liquid are forced over the ICs of the logic modules 28 by the pressure and turbulent flow of cooling gas and partially or fully covers the ICs with a thin coating of cooling liquid. The turbulence in the flow of the small liquid droplets reduces the inhibiting effects of the thermal barriers which cause thermal hysteresis and boundary layer effects, contacts the liquid and the gas intimately with the ICs (or their packages, if the ICs are packaged) and more rapidly and effectively removes the higher heat densities generated by the ICs in the logic module chamber 24. Heat from the ICs is more effectively removed as the sensible heat gain of the liquid and gas and the latent heat gain of the liquid during vaporization. "Sensible" is used herein in the typical sense to refer to heat gain which can be sensed as a change in temperature, and "latent" is used the typical sense to refer to heat gain which can not be measured as a temperature change.

To cool the power supply equipment, cooling liquid from the liquid circulation cooling loop 30 is circulated through the power supply components 29, which are immersed in a pool 38 of cooling liquid in the power supply chamber 26. The power supply components 29 are cooled primarily by sensible heat gain of the circulating cooling liquid. Immersion cooling from the sensible heat gain of the cooling liquid surrounding the power supply components is generally adequate for the lower heat density generation and wider range of temperature tolerances of the power supply equipment.

Some of the vaporized cooling liquid leaving the logic module chamber 24 condenses into liquid in a separation chamber 40, thereby delivering some of the heat of liquid vaporization to the cooling gas which also enters the separation chamber 40 after passing through the logic module chamber 24. A portion of the cooling liquid passing through the logic module chamber 24 is also unvaporized, and this unvaporized cooling liquid, together with the condensed cooling liquid, falls as a rain of droplets into the pool 38 of cooling liquid in the power supply chamber 26.

The gas cooling loop 34 withdraws a mixture of cooling gas and cooling liquid vapor from the separation chamber 40 at a suction port 42, and extracts heat from the mixture at a heat exchanger 44. A fraction of the vaporized cooling liquid in the gas cooling loop 34 condenses and is returned to the liquid cooling loop 30 by a return conduit 46. The cooling gas and the remaining cooling liquid vapor are introduced under pressure in the logic module chamber 24, where the pressurized cooling gas and remaining vaporized fraction of cooling liquid force the droplets sprayed from the nozzles 32 to flow through and over the logic modules 28. The volumetric flow of the cooling gas is greater than the volumetric flow of the cooling liquid in the mixture which flows through and over the modules 28. The interaction of the gas and the liquid with the components in the logic modules 28 induces turbulence to overcome thermal hysteresis effects and boundary layer effects. Heat from the liquid cooling loop 30 is removed from a heat exchanger 48. Thus the cooling system 20 provides thermodynamic and fluid dynamic processes which are suited to the individual needs of the two distinct types of components to be cooled. Immersion cooling and cooling by sensible heat gain to the cooling liquid are adequate for the power supply components. The more stringent cooling requirement of the logic modules, on the other hand, are met by combining the latent heat gain of vaporization of the cooling liquid with the sensible heat gain of the cooling liquid and gas in a turbulent regime to reduce or eliminate the thermal hysteresis and boundary layer effects.

The cooling gas and the cooling fluid are selected to cooperate with one another to achieve the described effects. The cooling liquid is preferably selected from a group of fluorocarbon (FC) cooling liquids manufactured by Minnesota Mining and Manufacturing Company under the trademark Fluorinert. These FC cooling liquids have relatively high dielectric strengths and are chemically inert, which allow them to make intimate contact with the electronic components and the circuit patterns without degrading the components or causing electrical short circuits. The FC cooling fluids also have relatively low viscosities, relatively high heat capacities and relatively low boiling points. These characteristics of the FC cooling fluids also make them advantageous in a thermodynamic sense as described herein. Helium is presently preferred for the cooling gas because it is chemically and electrically inert, and will therefore not react chemically with the cooling liquid or the components of the computer and will not ionize at the relatively low voltages present in the logic module chamber. Further, helium has a low molecular weight which gives it a higher sensible heat capacity than any other gas, with the exception of hydrogen. Hydrogen is currently regarded as undesirable for use around electronic equipment because of its high reactivity. Other cooling liquids and cooling gases may be suitable for use in the present invention.

Figure 2:
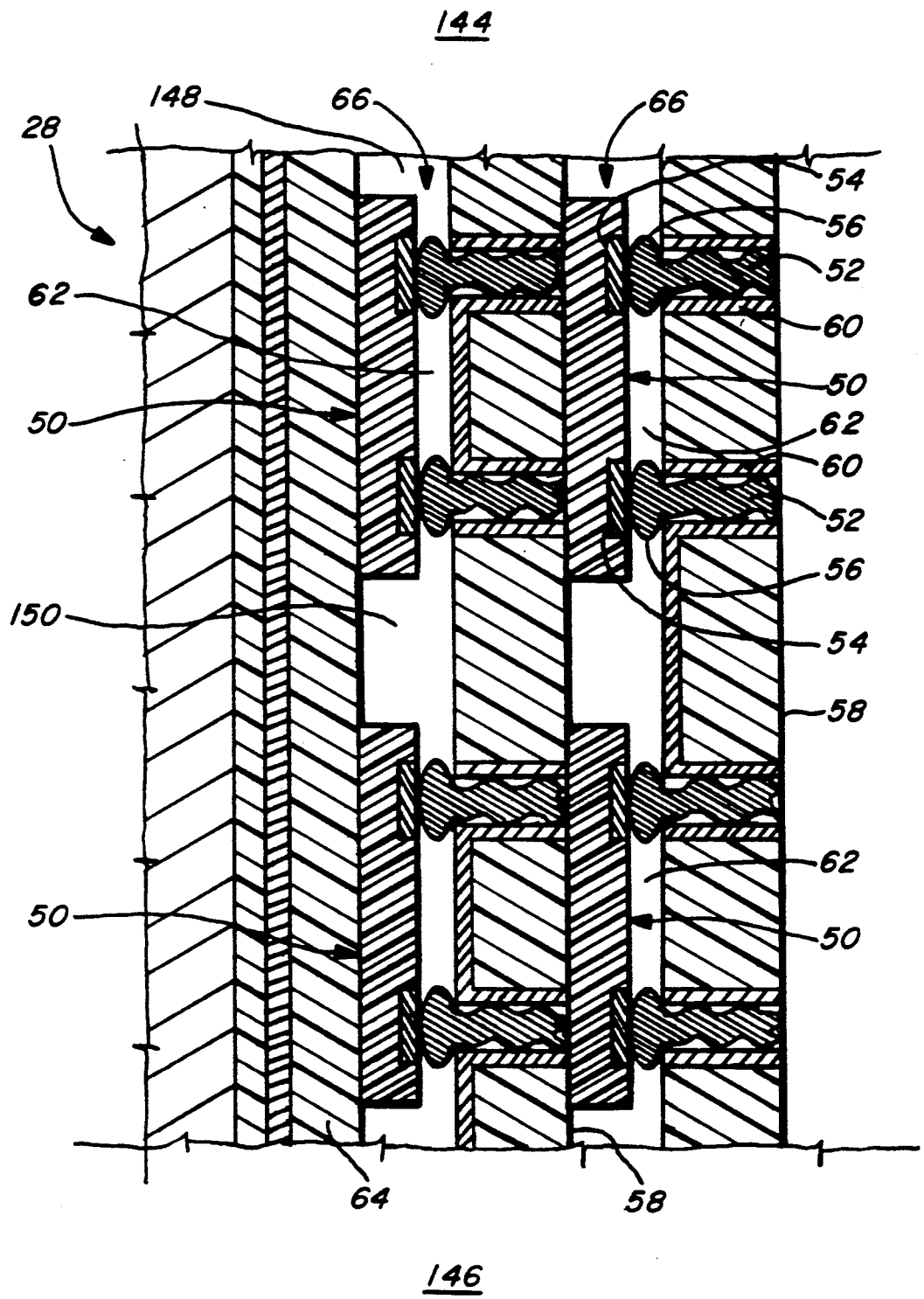
FIG. 2 is a sectional view of a portion of a typical logic module of the computer shown in FIG. 1.
Figure 3:
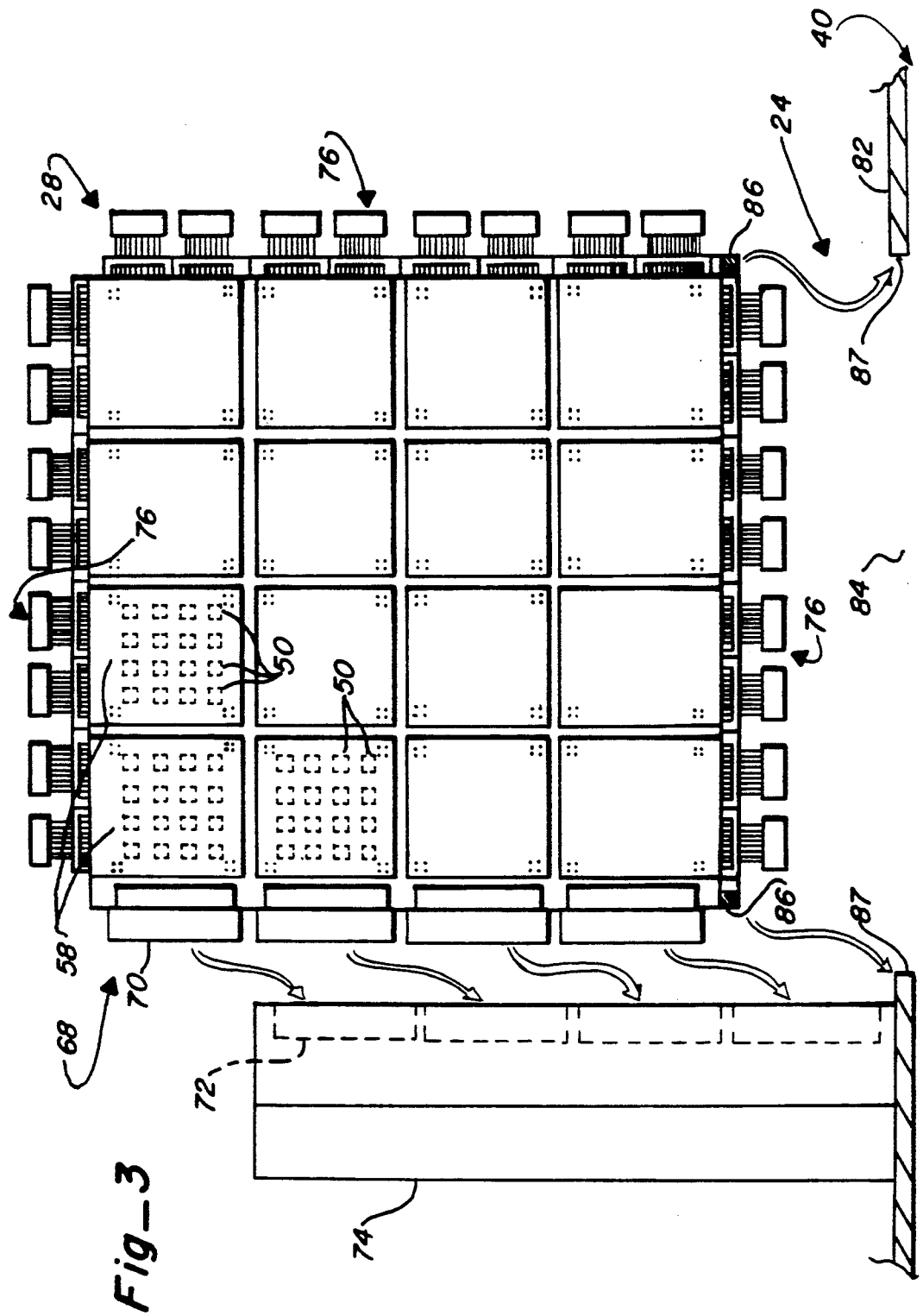
FIG. 3 is a side elevational view of the logic module shown in FIG. 2.
Figure 4:
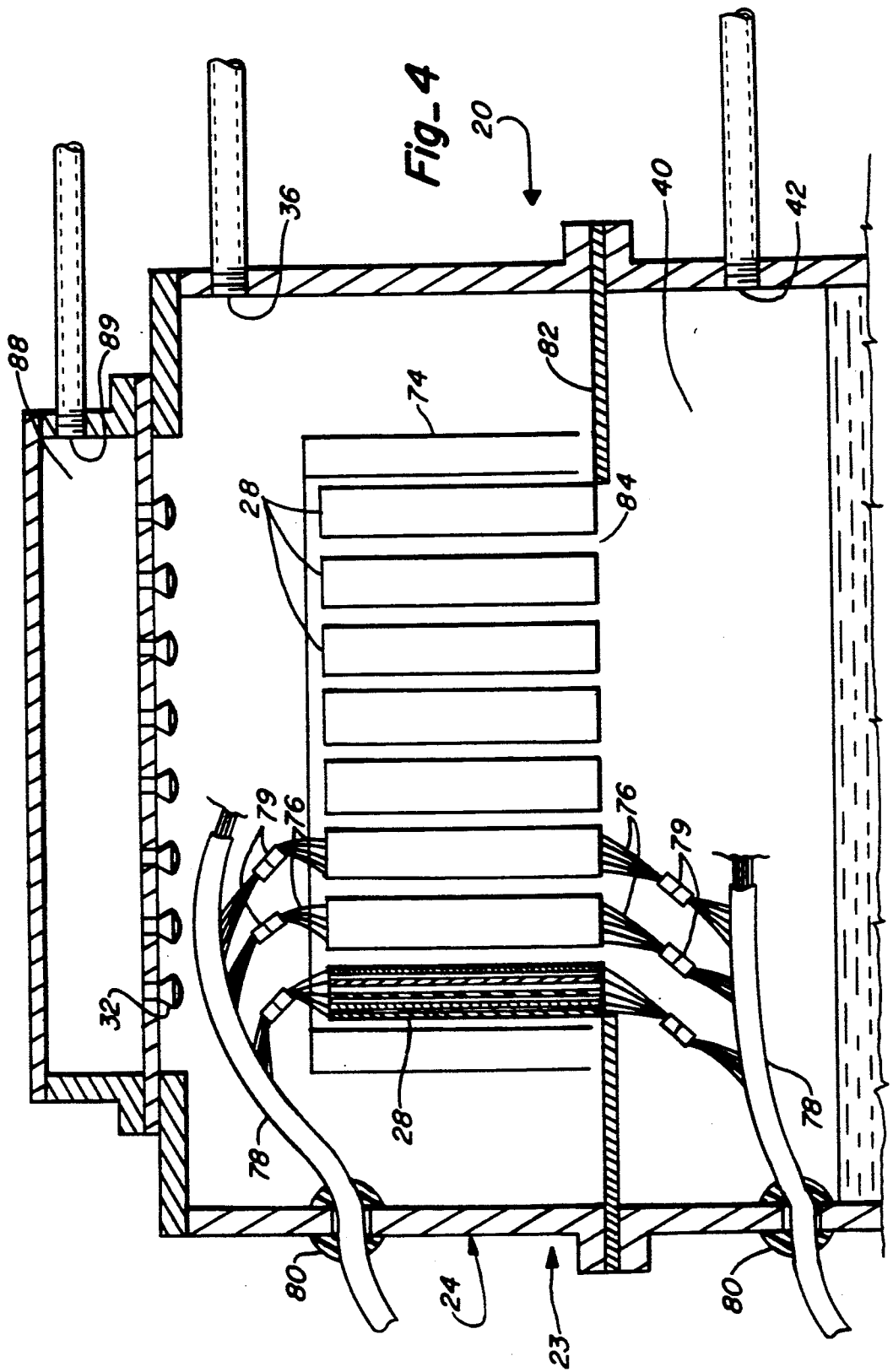
FIG. 4 is a sectional view of a logic module chamber of the computer and a portion of the cooling system shown in FIG. 1.

In order to more fully appreciate the improved cooling effect achieved in logic module chamber 24, some of the important considerations applicable to a typical logic module 28 are described in conjunction with FIGS. 2, 3 and 4. It should be understood, however, that these details are illustrative of a number of structural arrangements of the logic modules with which the present invention can be advantageously used.

Referring to FIG. 2, each one of a plurality of ICs 50 is preferably a semiconductor chip, not contained in the typical plastic package. In unpackaged form each of the ICs consumes considerably less space than in the packaged form. However, the present invention is also applicable to the use of packaged ICs. Each of the plurality of ICs 50 has a plurality of leads 52, each attached to a corresponding contact pad 54 formed in one surface of the IC 50. Each lead 52 is preferably attached by ultrasonic bonding to the contact pad 54, and, when attached in this manner, a ball end 56 of the lead is formed above the contact pad 54. The ICs 50 are mounted to a PCB 58 by inserting the leads 54 into correspondingly located plated through-holes 60 formed in the PCB 58. The ball ends 56 serve as a spacers for positioning each IC away from the PCB to which it is attached. The space between the IC and the PCB to which it is attached creates a constricted passageway 62 between the PCB 58 and the IC 50. Details concerning the manner of attachment and the position of the ICs relative to the PCB are more fully disclosed in U.S. patent application Ser. No. 07/053,142, filed May 21, 1987, which is assigned to the assignee of the present invention.

In the preferred embodiment sixteen ICs 50 are attached to each PCB 58, as is shown in FIG. 3. A plurality of layers of PCBs 58 are attached to a larger PCB or combination of PCBs, referred to as a circuit card assembly 64. In the preferred embodiment two layers of sixteen PCBs each are attached to each of two sides of the circuit card assembly 64. The circuit card assembly 64 may comprise one or a plurality of power plane and circuit connection cards, and is assembled in a layered three dimensional structure to form the logic modules 28. Details regarding the structure and arrangement of the components of each logic module 28 are more completely described in U.S. patent application Ser. Nos. 07/053,142, filed May 21, 1987, 347,507, filed May 4, 1989, 07/386,298, filed July 27, 1989, and 07/514,065, filed April 26, 1990, all of which are assigned to the assignee of the present invention.

As shown in FIG. 2, the PCBs 58 may be oriented with the outer sides of the ICs 50 in direct physical contact with a circuit card assembly 64 or an adjacent PCB 58, or there may be a space between the outer sides of the ICs and the adjacent circuit card assembly or PCB. In either event, a channel 66 is formed between each PCB 58 and an adjacent PCB 50 or an adjacent circuit card assembly 64. The ICs 50 protrude into the channels 66 or are otherwise in a heat communicating relationship with fluid within the channels. Each channel 66 further comprises relatively unconstricted areas and relatively constricted areas, formed in part by the passageways 62. The configuration of the constricted and unconstricted areas depends on the particular arrangement of the ICs on the PCBs, the arrangement of the PCBs on the circuit cards and the assembly of the circuit cards into the logic modules 28. It is through the channels 66, including the passageways 62, that the cooling liquid and the cooling gas flow through the logic modules 28 and contact with the ICs and other elements of the logic modules to remove heat. The channels 66, are comprise in part the passageways 62, thus serve as fluid flow conduits through the logic modules 28. In addition to the ICs 50, other types of heat generating components, such as connector pins, may extend into the channels 66, thereby serving as heat conductors from segments of the logic modules which are not in direct physical contact with the channels 66.

As can be seen in FIG. 3, each logic module 28 has a first edge 68 with a plurality of power supply connectors 70 attached thereto. The power supply connectors 70 connect to receptacles 72 of a power supply bus 74, by which to supply electrical power to the logic module 28. A wire mat 76 is usually attached to the other three edges of the logic module. Each wire mat 76 comprises a plurality of individual electrical conductors which carry signals to and from the PCBs and ICs of each logic module 28. The signals are transmitted and received over a plurality of cable assemblies 78 which attach by connector couplers 79 to each wire mat 76, as is shown in FIG. 4. The cable assemblies 78 pass out of the housing 23 which defines the logic module chamber 24 and the separation chamber 40 through gas- and liquid- tight cable seals 80.

The number of electrical conductors in each wire mat 76, their close adjacency, and the connector couplers 79 between each wire mat 76 and the cable assemblies 78 presents a relatively dense restriction and impediment to the flow of cooling liquid and cooling gas into the channels 66 and passageways 62. In one type of logic module 28, each wire mat 76 comprises over 700 wires in approximately a four inch long space.

A plurality of logic modules 28 are installed in the logic module chamber 24. The logic modules 28 are preferably installed parallel to one another and are oriented in vertical planes, as is shown in FIG. 4. The power supply bus 74 is installed 24 near one side of the logic module chamber 24 and is constructed so that the edge of each logic module upon which the power supply connectors 70 are located is vertical when inserted into the corresponding receptacles 72 of the power supply bus 74, as is shown by FIG. 3. A partition 82 separates the logic module chamber 24 from the separation chamber 40. An opening 84 is formed in the partition 82 through which the cooling liquid and the cooling gas in the logic module chamber 24 can pass from the channels 66 (FIG. 2) and passageways 62 (FIG. 2) in the logic modules into the separation chamber 40. The power supply bus 74 is located so that the logic modules 28 are positioned directly above the opening 84. Sealing means in the form of resilient gaskets 86 are attached to the lower corners of each logic module 28, as is shown in FIG. 3. When the logic modules 28 are attached to the power supply bus 74, the gaskets 86 contact the edges 87 of the partition 82 on opposite sides of the opening 84. Any space between the adjacent parallel oriented logic modules may be sealed or, if the space is small enough, may be left open. Thus, the only path for flow of cooling liquid and cooling gas from the logic module chamber 28 to the condensation chamber 40 is through the channels 66 and passageways 62 (FIG. 2) of the logic modules 28 and through any slight unsealed space between adjacent logic modules.

A rectangular array of the spray nozzles 32 is located above the logic modules, as is shown in FIG. 4. Preferably, there is one nozzle 32 for each 0.6 square inches of array area. A manifold 88 which is formed by part of the housing 23 distributes cooling liquid to the nozzles 32. Cooling liquid is supplied to the manifold 88 from a supply conduit at a liquid inlet port 89 which is part of the liquid cooling loop 30 (FIG. 1). The plurality of spray nozzles 32 are arranged in a manner 10 that will provide a relatively uniform spray of droplets of cooling liquid to cover the logic modules 28.

Referring to FIG. 1, the cooling gas circulation loop 32 functions as a source of pressurized cooling gas, delivering the pressurized cooling gas to the logic module chamber 24. The gas loop 34 is primarily operative only with respect to logic module 28 cooling. The cooling liquid circulation loop 30 functions as a source of cooling liquid, delivering cooling liquid to the nozzles 32 within the logic module chamber 24 to achieve the cooperative cooling effect with the gas in the logic module chamber 24. The liquid loop 30 is further operative to cool the power supply components 29 in the power supply chamber 26.

The cooling gas circulation loop 34, which delivers the pressurized cooling gas to the logic module chamber 24, includes a gas blower 90 which draws gas from the separation chamber 40. The separation chamber 40 is located below the opening 84 from the logic module chamber 24 and above the liquid level of the cooling fluid pool 38 in the power supply chamber 26. The gas present in the separation chamber 40 is a mixture of vaporized cooling liquid and cooling gas. The cooling fluid was vaporized as it passed through the channels 66 and passageways 62 between and over the ICs 50 (FIG. 2) of the logic modules 28. The gas mixture is drawn from the separation chamber 40 through a gas filter 92 to remove any contamination. The blower 90 is preferably a rotary lobe positive displacement blower, such as a Roots (TM) blower as manufactured by Dresser Industries, Inc. Any type of blower or compressor with suitable flow and pressurization characteristics is suitable for use in the present invention.

The blower 90 pressurizes the gas mixture obtained from the separation chamber 40 and raises its temperature. The pressurized gas mixture is passed through a hot side 94 of a the heat exchanger or aftercooler 44. The gas mixture gives up sensible and latent heat to a heat exchange fluid which flows through a cold side 96 of the aftercooler 44, cooling the gas mixture and condensing any cooling liquid within the gas. The saturation capacity of the gas mixture is lowered in the aftercooler 44, causing a substantial portion of the cooling liquid vapor to give up latent heat and condense into liquid form. The mixture leaving the aftercooler 44 is saturated cooling gas, condensed cooling liquid and some portion of cooling liquid vapor which did not condense in the aftercooler.

The mixture leaving the aftercooler 44 is passed through a vortex separator 98. The vortex separator 98 employs centrifugal force to separate the condensed cooling liquid from the saturated cooling gas and cooling liquid vapor mixture. The condensed cooling liquid which is separated in the separator 98 is collected for return to the cooling liquid circulation loop 30 through the return conduit 46. The remaining mixture leaving the separator 98 is a cooled saturated mixture of cooling gas and cooling liquid vapor which is introduced to the logic module chamber 24 at the cooling gas inlet port 36.

The blower 90 pressurizes the cooling gas sufficiently so that the operating cooling gas pressure in the logic module chamber 24 approximately 4 psig higher than the operating cooling gas pressure in the separation chamber 40. The pressure of cooling gas in the logic module chamber 24, and hence the pressure differential across the logic modules 28 is regulated by a regulating type of bypass valve 100. The bypass valve 100 connects between the pressurized gas inlet port 36 in the logic module chamber 24 and the gas suction port 42 in the separation chamber 40, and regulates the pressure within the logic module chamber by controlling the amount of gas which bypasses the logic module chamber 24. The gas pressure difference between the gas inlet port 36 and the gas suction port 42 establishes the desired flow rate of cooling gas and the flow of sprayed cooling liquid through and over the logic modules 28. Thus it is possible to control the rate of flow of the mixture of cooling gas and liquid through the logic module chamber 24 by the degree of pressurization of the gas in the chamber 24.

The cooling liquid circulation loop 30 includes a circulating pump 102 which draws liquid from the pool of cooling liquid 38 in the power supply chamber 26 and from the return conduit 46 from the vortex separator 98. The circulating pump 102 is preferably a centrifugal pump. The cooling liquid is moved through a hot side 104 of the heat exchanger 48. As the cooling liquid passes through the heat exchanger 48, the liquid gives up sensible heat to a heat exchange fluid which passes through a cold side 106 of the heat exchanger 48. The temperature of the cooling liquid is thereby lowered. The cooled liquid leaves the heat exchanger 48 and is supplied to the manifold 88 (FIG. 4) of the array of spray nozzles 32 and to the upper region of the pool of cooling fluid 38 in the power supply chamber 26. A bypass valve 108 selectively controls the proportion of liquid leaving the pump 102 which is supplied to the array of spray nozzles 32 and the portion which is returned directly to the power supply chamber 26.

The power supply components 29 are located in the lower region of the power supply chamber 26. The power supply equipment 29 is completely immersed in the pool of cooling liquid 38. The cooling liquid gains sensible heat from the power supply components 29 and from the sensible heat of the rain of un-vaporized and condensed cooling liquid falling through the separation chamber 40 and into the pool of liquid 38 in the power supply chamber 26 from the logic module chamber 28. This sensible heat is then removed from the system as the cooling liquid is circulated through the cooling liquid heat exchanger 48 as described above.

A filling and draining subsystem 110 allows cooling liquid and cooling gas to be introduced and removed from the circulation loops 30 and 34. Cooling gas is initially stored in a canister 112, and cooling liquid is initially stored in a reservoir 114. Prior to filling the system with either the cooling gas or the cooling fluid, the system is evacuated by connecting a vacuum source (not shown) to a vacuum pull down port 116 which is connected by a valve 118 to the interior of the cooling system 20. Thereafter cooling liquid is admitted to the power supply chamber 26 by a pump 120 which transfers liquid from the reservoir 114 through a valve 122. Once the level of fluid in the power supply chamber 26 has reached its desired level, the flow of liquid from the reservoir 114 is terminated and the valve 122 is closed. The remaining interior space in the system not occupied by the liquid is further evacuated by the vacuum source connected to the pull down port 116 until the desired amount of evacuation is achieved. After evacuation of the system and closure of the valve 118, gas is released from the canister 112 until the desired degree of pressurization is achieved, for example 2.5 psig in the preferred embodiment. To drain the system of the liquid and gas, the above process is substantially reversed.

Figure 5:
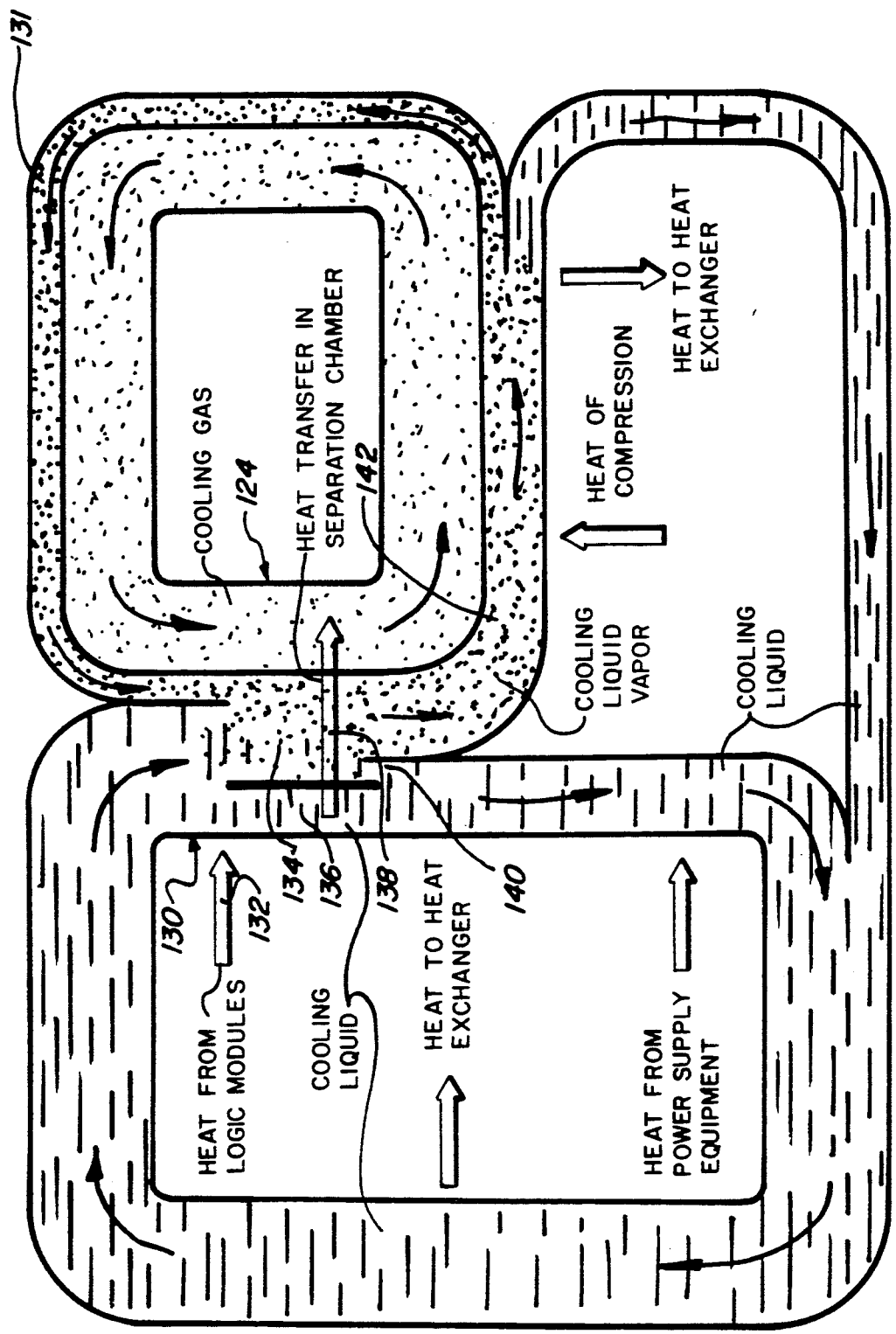
FIG. 5 is qualitative schematic mass flow diagram of the thermodynamic flows applicable to the cooling system of the present invention.

The improved and beneficial cooling effect of the flow of gas and liquid through and over the logic modules 28 and within the circulation loops 30 and 34 can be better understood by reference to FIGS. 1 and 5. Because the cooling gas in the logic module chamber is at a higher pressure than in the separation chamber, cooling gas (represented at 124 in FIG. 5) will flow from the logic module chamber through the wire mats connected to the edges of the logic modules in the logic module chamber, through the channels and passageways of the logic modules, over ICs, through the wire mat on the lower edge of the logic modules, and through the opening between the separation and logic module chambers. As the cooling gas moves through the logic modules, the gas will drive the droplets of cooling liquid (represented at 130 in FIG. 5) through the logic modules.

The mixture of cooling gas (124, FIG. 5) and cooling liquid droplets (130, FIG. 5) and uncondensed vaporized cooling liquid (represented at 131 in FIG. 5) is forced through the channels and passageways of the logic modules and over the ICs. The gas flow induces turbulence in the liquid in contact with the ICs. Heat (represented at 132 in FIG. 5) is absorbed from the ICs by sensible heat gain in the gas (124, FIG. 5), the vaporized liquid (131, FIG. 5) and the liquid (130, FIG. 5) due to forced convection, which raises the temperature of the cooling gas and the cooling liquid droplets. Cooling liquid which comes into contact with the ICs may have its temperature raised to its boiling point, at which point the liquid (130, FIG. 5) gains latent heat of vaporization and vaporizes. Thus in the channels of the logic modules, there will exist a three-part mixture of cooling gas (124, FIG. 5), unvaporized cooling liquid (136, FIG. 5) and vaporized cooling liquid (134, FIG. 5). The three-part mixture may reach or approach conditions of saturation of the cooling gas with cooling liquid vapor.

When the three-part mixture in the channels passes from the logic modules it encounters the environment of the separation chamber. The average temperature of the gas in the separation chamber is lower than the temperature of those portions of the entering three-part mixture. The three-part mixture gives up heat (represented at 138 in FIG. 5) to the cooling gas in the separation chamber, resulting in a lower saturation capacity for the vaporized cooling liquid. The portion of the vaporized cooling liquid which exceeds the saturation capacity of the mixture in the separation chamber gives up its latent heat of vaporization to the gas in the separation chamber, causing sensible heat gain in the gas in the separation chamber and condensing some of the vaporized cooling liquid. The condensed cooling liquid (represented at 140 in FIG. 5) falls, together with the unvaporized cooling liquid (136, FIG. 5) as a rain into the pool of cooling liquid in the power supply chamber. The rain of cooling liquid (136 and 140, FIG. 5) adds its sensible heat to the pool of cooling liquid in the power supply chamber. The resulting mixture of gas in the separation chamber is a saturated mixture of cooling gas (124, FIG. 5) and cooling liquid vapor (142, FIG. 5) at the intermediate temperature which is conducted through the gas circulation loop 34 as previously described.

The turbulence improves the very beneficial cooling effects in the logic module chamber. Turbulence occurs as a result of the exemplary effect next described. Referring to FIG. 2, as the cooling liquid and the cooling gas move through the logic modules 28 from a high pressure area 144 in the logic module chamber 24 (FIG. 1) to a low pressure area 146 in the separation chamber 40 (FIG. 1), both the gas and the liquid pass over the surfaces of the ICs 50. As the cooling liquid and cooling gas pass through the channels 66 and passageways 62 between the ICs 50 and the PCBs, the ICs 50 and the leads 52 give up heat to the cooling liquid. Simultaneously the cooling gas is moving at a higher velocity through the logic module 28. The passageways 62 are relatively constricted areas between relatively unconstricted areas 148 and 150 of the channel 66. As cooling gas flow passes through the constricted passageway 62 the velocity of flow increases and potential energy of the cooling gas in the form of pressure is converted to kinetic energy, creating a zone of reduced pressure in the constricted passageway 62. The pressure differential between the constricted passageway 62 and the unconstricted area 148 pushes the cooling liquid from the surface of the IC 50 and induces turbulence due to the abrupt transition from an unconstricted area 148 to the constricted passageway 62 and from the constricted passageway 62 to a next unconstricted area 150. This is repeated several times as the cooling gas and cooling liquid passes through the channels 66 and passageways 62 in the logic module 28.

The turbulence thus induced has two beneficial thermodynamic effects. First, it clears fluid and vapor from the surface of the ICs 50 before the liquid can form immersion pools in the module 28. This allows the cooling liquid vapor to be released from the surface of the ICs and greatly reduces or prevents thermal hysteresis. Second, the turbulent flow regime prevents the formation of stagnant boundary layers of liquid, vapor or gas at the surface of the ICs. This changes the predominant heat transfer mode from conduction to forced convection. In addition to inducing turbulence, the cooling gas flow from the high pressure area 144 to the low pressure area 146 is the driving force which propels the cooling liquid through the logic modules 28 and which keeps cooling liquid vapor from accumulating in the logic module. Thus, very substantial improvements in cooling are available from the present invention.

A presently preferred embodiment of the present invention and many of its improvements have been described with a degree of particularity. It should be understood that this description has been made by way of preferred example, and that the invention is defined by the scope of the following claims.

The invention claimed is:

1. A cooling system for an electronic computer having a plurality of circuit modules located in a circuit module chamber and power supply equipment located in a power supply chamber, each module including a plurality of relatively closely spaced apart heat generating integrated circuits (ICs) mounted within the interior of the module and located in a direct heat communicating relationship with an elongated interior channel which is formed in substantial part by the spaces between the ICs, the power supply equipment including a plurality of relatively farther spaced apart heat generating components, said cooling system comprising, in combination:

means for immersing the power supply components in a pool of cooling liquid in the power supply chamber and for circulating the cooling liquid in the pool around the power supply components to remove heat from the power supply components;

means for supplying cooling liquid to the circuit module chamber and for directing the cooling liquid onto the modules; and means for supplying a pressurized gas into the circuit module chamber to force the cooling liquid through the channels of each module and to remove heat from the ICs.

2. A cooling system as defined in claim 1 further comprising:

means for obtaining cooling liquid supplied to the circuit module chamber from the pool of liquid in the power supply chamber; and means for returning a portion of the cooling liquid which has traversed the channels of the modules to the pool of liquid in the power supply chamber.

3. A cooling system as defined in claim 2 wherein:

cooling liquid which is supplied to the circuit module chamber and returned to the power supply chamber is continually circulated from the pool of liquid in the power supply chamber.

4. A cooling system as defined in claim 3 wherein the means for returning a portion of the cooling liquid which has traversed the channels of the modules comprises:

a separation chamber positioned in fluid communication with the circuit module chamber located above the separation chamber and also positioned in fluid communication with the power supply chamber located below the separation chamber; and wherein:

the separation chamber allows cooling liquid which has traversed the channels of the circuit modules to fall into the pool of liquid in the power supply chamber.

5. A cooling system as defined in claim 4 further comprising:

gas loop circulation means connected to the separation chamber and the means for supplying pressurized gas and operative for cooling and pressurizing the gas withdrawn from the separation chamber before supplying the pressurized gas to the means for supplying the pressurized gas.

6. A cooling system as defined in claim 5 further comprising:

liquid loop circulation means connected to the power supply chamber and operative for cooling liquid withdrawn from the pool before returning the cooled liquid to the pool.

7. A cooling system as defined in claim 6 wherein the cooling liquid is a fluorocarbon and the cooling gas is an inert gas.

8. A cooling system as defined in claim 1 wherein:

the means for supplying and directing the cooling fluid further creates a spray of droplets of cooling fluid;

the means for supplying the pressurized gas further flows the gas through the spray of droplets to create a mixture in which a major volumetric proportion of the mixture is gas and minor volumetric proportion of the mixture is droplets of cooling liquid; and the mixture is forced through the channels by the pressure of the gas.

9. A cooling system as defined in claim 8 wherein:

the ICs are cooled by transferring heat to the mixture while in the channels by vaporizing a fraction of the cooling liquid in the channels by latent heat gain of the vaporized fraction of the cooling liquid, and by sensible heat gain of the unvaporized fraction of the cooling liquid.

10. A cooling system as defined in claim 9 wherein:

the gas is a cooling gas; and the ICs are cooled secondarily by sensible heat gain of the cooling gas in the channels.

11. A cooling system for an electronic computer having a plurality of circuit modules located in a circuit module chamber and power supply equipment located in a power supply chamber, each module including a plurality of relatively closely spaced apart heat generating integrated circuits (ICs) mounted within the interior of the module and located in a direct heat communicating relationship with an elongated interior channel which is formed in substantial part by the spaces between the ICs, the power supply equipment including a plurality of relatively farther spaced apart heat generating components, said cooling system comprising, in combination:

means for immersing the power supply components in a pool of cooling liquid in the power supply chamber and for circulating the cooling liquid in the pool around the power supply components to remove heat from the power supply components;

means for supplying cooling liquid to the circuit module chamber and for creating a spray of droplets of cooling fluid which is directed onto the modules; and means for supplying a pressurized gas into the circuit module chamber and for flowing the gas through the spray of droplets to create a mixture in which a major volumetric proportion of the mixture is gas and minor volumetric proportion of the mixture is droplets of cooling liquid, the pressure of the gas supplied forcing the mixture through the channels to remove heat from the ICs by transferring heat to the mixture while in the channels from vaporizing a fraction of the cooling liquid in the channels by latent heat gain of the vaporized fraction of the cooling liquid and from sensible heat gain of the unvaporized fraction of the cooling liquid; and a separation chamber positioned in fluid communication with the circuit module chamber which is above the separation chamber and also positioned in fluid communication with the power supply chamber which is below the separation chamber; and wherein:

the unvaporized fraction of the cooling liquid of the mixture falls through the separation chamber into the pool in the power supply after the mixture exits the channels; and a portion of the vaporized fraction of the cooling liquid of the mixture exiting the channels condenses in the separation chamber and falls through the separation chamber into the pool in the power supply chamber.

12. A cooling system as defined in claim 11 further comprising:

gas loop circulation means for withdrawing the gas and the uncondensed vaporized fraction of the cooling liquid from the separation chamber and for delivering gas to the means for supplying a pressurized gas, the gas loop circulation means further comprising:

means for condensing a further portion of the uncondensed vaporized fraction of the cooling liquid withdrawn from the separation chamber.

13. A cooling system as defined in claim 12 further comprising:

means connecting the gas loop circulation means and the power supply chamber for returning at least a portion of the further condensed portion of the cooling liquid to the pool of cooling liquid in the power supply chamber.

14. A cooling system as defined in claim 12 wherein the gas loop circulation means further comprises:

means for increasing the pressure of the gas and the uncondensed vapor fraction of the cooling liquid withdrawn from the separation chamber; and wherein the means for condensing a further portion of the cooling liquid from the uncondensed vaporized fraction of the cooling liquid withdrawn from the separation chamber further comprises:

heat exchanger means for receiving the gas and uncondensed vapor fraction of cooling liquid from the pressure increasing means and operative for extracting heat to condense the further portion of the cooling liquid from the uncondensed vaporized fraction of the cooling liquid withdrawn from the separation chamber; and separator means for separating the further portion of cooling liquid from the remaining amount of uncondensed cooling liquid and the gas.

15. A cooling system as defined in claim 14 wherein the cooling liquid is a fluorocarbon and the cooling gas is an inert gas.

16. A cooling system as defined in claim 9 wherein:

the proportion of the cooling liquid and gas in the mixture flowing in the channels and the flow rates of the gas and cooling liquid are selected to induce turbulence in the unvaporized fraction of the cooling liquid while moving across the components in the channels.

17. A cooling system as defined in claim 16 wherein:

the predetermined gas pressure forces the unvaporized fraction of the cooling liquid to coat the ICs as the mixture passes through the channels.

18. A cooling system as defined in claim 17 wherein:

the turbulence imparted by the pressurized gas is sufficient to substantially break up thermal barriers and to substantially avoid thermal hysteresis.

19. A cooling system as defined in claim 1 wherein the relatively closed spacing of the ICs and the number of ICs in each module create a relatively high density of heat generation compared to the density of heat generated by the power supply components.

20. A cooling system for an electronic circuit module which includes a plurality of spaced apart electronic heat generating components mounted within the interior of the module and located in a direct heat communicating relationship with at least one elongated interior channel which is formed in substantial part by the spaces between the components, said cooling system comprising:

a chamber having a interior space and an opening through which fluid exits from the chamber;

means for positioning the module in the chamber in a predetermined position in which a first end of the channel communicates with the interior space and the other second end of the channel communicates with the opening;

means for supplying a cooling liquid into the interior space of the chamber and for directing the cooling liquid into the first end of the channel of the module; and means for supplying a flow of gas at a predetermined pressure into the interior space of the chamber, the predetermined pressure of the gas forcing the cooling liquid through the channel from the first end to the second end and into contact with the electronic components within the interior of the module.

21. A cooling system as defined in claim 20 wherein:

the means for supplying cooling liquid operatively supplies the cooling liquid as a spray of droplets within the chamber;

the spray of droplets and the flow of gas form a mixture of droplets and gas in the chamber; and the predetermined gas pressure forces the mixture through the channel.

22. A cooling system as defined in claim 21 wherein:

the mixture coats the components with cooling liquid as the mixture flows through the channel.

23. A cooling system as defined in claim 22 wherein:

the proportion of the droplets and the gas in the mixture and the flow of the gas and the droplets are predetermined to induce turbulence in the cooling liquid moving across the components.

24. A cooling system as defined in claim 23 wherein:

the turbulence is sufficient to substantially break up thermal barriers and to substantially avoid thermal hysteresis.

25. A cooling system as defined in claim 23 wherein:

a fraction of the cooling liquid within the channel is vaporized by absorption of heat from the components.

26. A cooling system as defined in claim 25 wherein:

the components are cooled by latent heat gain of the vaporized fraction of the cooling liquid and by sensible heat gain of the unvaporized fraction of the cooling liquid.

27. A cooling system as defined in claim 26 wherein:
the gas is a cooling gas; and
the components are also cooled by the sensible heat gain of the cooling gas within the channel.

28. A cooling system as defined in claim 27 further comprising:
a portion of the vaporized fraction of the cooling liquid of the mixture exiting the channel condenses upon exiting the channel.

29. A cooling system as defined in claim 20 wherein:
a fraction of the cooling liquid within the channel is vaporized by absorption of heat from the components.

30. A cooling system as defined in claim 29 wherein:
the components are cooled by latent heat gain of the vaporized fraction of the cooling liquid and by sensible heat gain of the unvaporized fraction of the cooling liquid.

31. A cooling system for an electronic computer having a plurality of power supply components and a plurality of circuit modules, each module including a plurality of relatively closely spaced apart heat generating integrated circuits (ICs), said cooling system comprising, in combination:
means for immersing the power supply components in a pool of cooling liquid;
means for circulating the cooling liquid in the pool around the power supply components to remove heat from the power supply components;
means for spraying droplets of cooling liquid over the modules and the ICs; and
means for flowing a pressurized cooling gas onto the modules and ICs to create a mixture of droplets and cooling gas which is forced over the modules and ICs to remove heat.

32. A cooling system as defined in claim 31 wherein:
the modules and ICs are cooled by transferring heat to the mixture by vaporizing a fraction of the cooling liquid by latent heat gain of the vaporized fraction of the cooling liquid, by sensible heat gain of the unvaporized fraction of the cooling liquid, and by sensible heat gain of the cooling gas.

33. A cooling system as defined in claim 31 wherein:
the proportion and flow rates of the cooling liquid and cooling gas are predetermined to induce turbulence in the cooling liquid moving across the modules and the ICs.

34. A cooling system as defined in claim 33 wherein:
the turbulence is sufficient to substantially break up thermal barriers and to substantially avoid thermal hysteresis.

35. A cooling system as defined in claim 34 wherein the cooling liquid is a fluorocarbon and the cooling gas is an inert gas.

36. A cooling system as defined in claim 31 wherein:
the number of ICs and the relatively close spacing of the ICs in each module create a relatively high density of heat generation compared to the density of heat generated by the plurality of relatively farther spaced apart power supply components.

37. A method of cooling an electronic computer having a plurality of power supply components and a plurality of circuit modules, each module including a plurality of heat generating integrated circuits (ICs), said method comprising:
immersing the power supply components in a pool of cooling liquid;
circulating the cooling liquid in the pool around the power supply components;
transferring heat from the power supply components to the cooling liquid in the pool;
removing heat from the circulating cooling liquid in the pool to cool the power supply components;
spraying droplets of cooling liquid over the modules and the ICs;
flowing a pressurized cooling gas through the spray of droplets to create a mixture of droplets and cooling gas;
flowing the mixture over the modules and the ICs;
transferring heat from the modules and ICs by absorbing heat in the flowing mixture; and
removing the flowing mixture from the modules and ICs after the heat has been transferred to the mixture to cool the modules and the ICs.

38. A method as defined in claim 37 wherein transferring heat from the modules and ICs in the flowing mixture further comprises:
vaporizing a fraction of the cooling liquid of the droplets by latent heat gain of the vaporized fraction of the cooling liquid;
absorbing heat in the unvaporized fraction of the cooling liquid of the droplets by sensible heat gain; and
absorbing heat in the cooling gas by sensible heat gain.

39. A method as defined in claim 38 further comprising:
coating at least a portion of the ICs and the modules with the unvaporized fraction of the cooling liquid of the droplets as the mixture passes over the ICs and modules.

40. A method as defined in claim 39 further comprising:
adjusting the proportion and flow rates of the cooling liquid and cooling gas in the mixture to induce turbulence in the cooling liquid moving across and coating the modules and the ICs.

41. A method as defined in claim 40 further comprising:
inducing sufficient turbulence in the cooling liquid to substantially break up thermal barriers and to substantially avoid thermal hysteresis.

42. A method as defined in claim 41 wherein the cooling liquid is a fluorocarbon and the cooling gas is an inert gas.

43. A method as defined in claim 42 wherein the inert gas is helium.

44. A method as defined in claim 41 further comprising:
forcing the mixture over the modules and ICs by the pressure of the cooling gas.

45. A method as defined in claim 40 further comprising:
creating in the mixture a major volumetric proportion of cooling gas and minor volumetric proportion of droplets of cooling liquid.

46. A method as defined in claim 40 wherein:
transferring heat from the power supply components to the cooling liquid in the pool further comprises:
absorbing heat in the cooling liquid in the pool by sensible heat gain.

47. A method as defined in claim 37 wherein the ICs are relatively closely spaced apart, mounted within the interior of the module, and are located in a direct heat communicating relationship with an elongated interior channel which is formed in substantial part by the spaces between the ICs, and said method further comprises:

forcing the mixture through the interior channel and over the modules and ICs by the pressure of the cooling gas.

48. A method as defined in claim 47 wherein:

transferring heat from the modules and ICs in the flowing mixture occurs in the channels and further comprises:

vaporizing a fraction of the cooling liquid of the droplets by latent heat gain of the vaporized fraction of the cooling liquid;

absorbing heat in the unvaporized fraction of the cooling liquid of the droplets by sensible heat gain; and absorbing heat in the cooling gas by sensible heat gain.

49. A method as defined in claim 48 further comprising:

coating at least a portion of the ICs and the modules with the unvaporized fraction of the cooling liquid of the droplets as the mixture passes over the ICs and modules in the channels.

50. A method as defined in claim 49 further comprising:

adjusting the proportion and flow rates of the cooling liquid and cooling gas in the mixture to induce turbulence in the cooling liquid moving across and coating the modules and the ICs.

51. A method as defined in claim 50 further comprising:

inducing sufficient turbulence in the cooling liquid to substantially break up thermal barriers and to substantially avoid thermal hysteresis.

52. A method as defined in claim 48 further comprising:

conducting the unvaporized fraction of the cooling liquid of the mixture into the pool after the mixture exits the channels;

condensing a portion of the vaporized fraction of the cooling liquid of the mixture after the mixture exits the channels; and conducting the condensed portion of the vaporized fraction of the cooling liquid of the mixture into the pool.

53. A method of cooling an electronic computer having a plurality of power supply components and a plurality of circuit modules, each module including a plurality of relatively closely spaced apart heat generating integrated circuits (ICs) which are mounted within the interior of the module in a direct heat communicating relationship with an elongated interior channel which is formed in substantial part by the spaces between the ICs, said method comprising:

immersing the power supply components in a pool of cooling liquid;

circulating the cooling liquid in the pool around the power supply components;

transferring heat from the power supply components to the cooling liquid in the pool;

removing heat from the circulating cooling liquid in the pool to cool the power supply components;

spraying droplets of cooling liquid;

flowing a pressurized cooling gas through the spray of droplets to create a mixture of droplets and cooling gas;

forcing the flow of the mixture through the interior channel by the pressure of the cooling gas;

transferring heat from the modules and ICs by absorbing heat in the flowing mixture in the channels by:

vaporizing a fraction of the cooling liquid of the droplets by latent heat gain of the vaporized fraction of the cooling liquid;

absorbing heat in the unvaporized fraction of the cooling liquid of the droplets by sensible heat gain; and absorbing heat in the cooling gas by sensible heat gain;

removing the flowing mixture from the channel after the heat has been transferred to the mixture to cool the modules and the ICs;

conducting the unvaporized fraction of the cooling liquid of the mixture after the mixture exits the channels;

condensing a portion of the vaporized fraction of the cooling liquid of the mixture after the mixture exits the channels;

conducting the condensed portion of the vaporized fraction of the cooling liquid of the mixture into the pool;

collecting the cooling gas and the uncondensed vaporized fraction of the cooling liquid after the mixture exits the channels;

pressurizing the gas and the uncondensed vapor fraction of the cooling liquid collected after the mixture exits the channels;

extracting heat from the pressurized cooling gas and uncondensed vapor fraction of cooling liquid to condense a further portion of the cooling liquid from the uncondensed vaporized fraction of the cooling liquid collected after the mixture exits the channels; and separating the further condensed portion of cooling liquid from the remaining amount of uncondensed cooling liquid and cooling gas.

54. A method as defined in claim 53 further comprising:

returning the further condensed portion of the cooling liquid to the pool of cooling liquid.

55. A method as defined in claim 53 further comprising:

flowing the pressurized uncondensed vaporized fraction of the cooling liquid and the cooling gas to create the mixture of droplets and cooling gas.

56. A method as defined in claim 47 wherein:

transferring heat from the modules and ICs in the flowing mixture occurs in the channels and further comprises:

adjusting the proportion and flow rates of the cooling liquid and cooling gas in the mixture to induce turbulence in the cooling liquid moving across and coating modules and the ICs in the channels.

57. A method as defined in claim 56 further comprising:

inducing sufficient turbulence in the cooling liquid to substantially break up thermal barriers and to substantially avoid thermal hysteresis.

58. A method as defined in claim 47 wherein:

transferring heat from the modules and ICs in the flowing mixture occurs in the channels and further comprises:

inducing sufficient turbulence in the cooling liquid in the channels to substantially break up thermal barriers and to substantially avoid thermal hysteresis.

59. A method as defined in claim 46 or 52 wherein the number of ICs and the relatively spacing of the ICs in each module create a relatively high density of heat generation compared to the density of heat generated by the plurality of relatively farther spaced apart power supply components.

60. A method as defined in claim 46 or 52 further comprising:

obtaining at least a portion of the cooling liquid of the droplets of the mixture from the pool of liquid; and returning a portion of the cooling liquid of the mixture to the pool of liquid after the mixture has flowed over the ICs and the modules.

61. A method as defined in claim 60 further comprising:

continually supplying cooling liquid to create the droplets in the mixture from the pool of liquid.

62. A method of cooling heat generating components, comprising:

spraying droplets of a cooling liquid;

flowing a pressurized cooling gas through the spray of droplets to create a mixture of droplets and cooling gas;

adjusting the volumetric quantities of cooling gas and cooling fluid to establish a major proportion of cooling gas and minor proportion of cooling liquid in the flowing mixture;

flowing the mixture over the components;

transferring heat from the components to the mixture flowing over the components by:

vaporizing a fraction of the cooling liquid of the mixture by latent heat gain of the vaporized fraction of the cooling liquid;

absorbing heat in the unvaporized fraction of the cooling liquid of the mixture by sensible heat gain; and absorbing heat in the cooling gas of the mixture by sensible heat gain.

63. A method as defined in claim 62 wherein the components are relatively closely spaced apart, are mounted within the interior of a module, and are located in a direct heat communicating relationship with an elongated interior channel which is formed in substantial part by the spaces between the components, and said method further comprises:

forcing the mixture through the interior channel and over the components by the pressure of the cooling gas.

64. A method of cooling as defined in claims 62 or 63 further comprising:

further adjusting the proportion of the cooling liquid and cooling gas in the mixture to move the unvaporized fraction of the cooling liquid across the components and to induce turbulence in the cooling liquid moving across the components.

65. A method as defined in claim 64 further comprising:

inducing sufficient turbulence in the cooling liquid to substantially break up thermal barriers and to substantially avoid thermal hysteresis.

66. A method of cooling a plurality of relatively closely spaced apart heat generating components which are mounted within the interior of a module in a direct heat communicating relationship with an elongated interior channel of the module which is formed in substantial part by the spaces between the components, comprising:

spraying droplets of a cooling liquid;

flowing a pressurized cooling gas through the spray of droplets to create a mixture of droplets and cooling gas;

adjusting the volumetric quantities of cooling gas and cooling fluid to establish a major proportion of cooling gas and minor proportion of cooling liquid in the flowing mixture;

forcing a flow of the mixture through the interior channel and over the components by the pressure of the cooling gas;

transferring heat from the components to the mixture flowing over the components by:

vaporizing a fraction of the cooling liquid of the mixture by latent heat gain of the vaporized fraction of the cooling liquid;

absorbing heat in the unvaporized fraction of the cooling liquid of the mixture by sensible heat gain; and absorbing heat in the cooling gas of the mixture by sensible heat gain;

condensing a portion of the vaporized fraction of the cooling liquid as the mixture exits the channels; and separating the unvaporized fraction of the cooling liquid and the condensed portion of the vaporized fraction of the cooling liquid from the cooling gas and the remaining uncondensed portion of the vaporized fraction of the cooling liquid after the mixture exits the channels.

67. A method of cooling as defined in claim 66 further comprising:

transferring heat from the condensed portion of the vaporized fraction of the cooling liquid to the cooling gas and the uncondensed portion of the vaporized fraction of the cooling liquid as the mixture exits the channels as a result of condensing the portion of the vaporized fraction of the cooling liquid; and extracting heat from the separated unvaporized fraction of the cooling liquid and the condensed portion of the vaporized fraction of the cooling liquid; and separately extracting heat from the separated cooling gas and the remaining uncondensed portion of the vaporized fraction of the cooling liquid.

68. A method of cooling as defined in claim 67 wherein the step of separately extracting heat from the separated cooling gas and the remaining uncondensed portion of the vaporized fraction of the cooling liquid further comprises:

separating a further portion of cooling liquid from the remaining portion of the uncondensed portion of the vaporized fraction of the cooling liquid.

69. A method of cooling as defined in claim 68 further comprising:

supplying the unvaporized fraction of the cooling liquid and the condensed portion of the vaporized fraction of the cooling liquid and the further portion of the cooling liquid as at least a portion of that cooling liquid sprayed as droplets; and supplying the separated cooling gas and the remaining portion of the uncondensed portion of the vaporized fraction of the cooling liquid to be flowed through the spray of droplets.

70. A method of cooling as defined in claim 69 wherein the step of separately extracting heat from the separated cooling gas and the remaining uncondensed portion of the vaporized fraction of the cooling liquid further comprises:

pressurizing the cooling gas and the remaining uncondensed portion of the vaporized fraction of the cooling liquid.

71. A method of cooling as defined in claim 70 wherein the components are electronic integrated circuits.

72. A method of cooling as defined in claim 70 for an electronic computer having a plurality of circuit modules and power supply equipment, each module including a plurality of relatively closely spaced apart heat generating integrated circuit (IC) components mounted within the interior of the module and located in a direct heat communicating relationship with the elongated interior channel which is formed in substantial part by the spaces between the IC components, the power supply equipment including a plurality of relatively farther spaced apart heat generating components, said method comprising:

immersing the power supply components in a pool of cooling liquid;

circulating the cooling liquid in the pool around the power supply components;

transferring heat from the power supply components to the cooling liquid in the pool by sensible heat gain of the cooling liquid in the pool; and extracting heat from the circulating cooling liquid in the pool to cool the power supply components.

73. A method of cooling as defined in claim 72 further comprising:

conducting the unvaporized fraction of the cooling liquid and the condensed portion of the vaporized fraction cooling liquid exiting the channels into the pool of cooling liquid.

74. A method of cooling as defined in claim 73 wherein the cooling liquid is a high dielectric strength fluorocarbon and the cooling gas is helium.

* * * * *